United States Patent [19]

Kawakatsu

[11] Patent Number: 4,873,200

[45] Date of Patent: Oct. 10, 1989

[54] METHOD OF FABRICATING A BIPOLAR TRANSISTOR

[75] Inventor: Akira Kawakatsu, Tokyo, Japan

[73] Assignee: Oki Electric Industry Co., Ltd., Tokyo, Japan

[21] Appl. No.: 183,883

[22] Filed: Apr. 20, 1988

[30] Foreign Application Priority Data

Apr. 20, 1987 [JP] Japan ................................. 62-95358

[51] Int. Cl.$^4$ .......................................... H01L 21/265
[52] U.S. Cl. ....................................... 437/31; 437/33; 437/162; 437/233; 148/DIG. 10; 148/DIG. 11; 357/34
[58] Field of Search ...................... 437/31, 32, 33, 162, 437/228, 225, 241, 233, 186, 193; 148/DIG. 10, DIG. 11; 357/34, 35; 156/643, 653, 657

[56] References Cited

U.S. PATENT DOCUMENTS

| | | | |
|---|---|---|---|
| 4,495,010 | 1/1985 | Kranzer | 437/31 |
| 4,731,341 | 3/1988 | Kawakatsu | 437/69 |
| 4,783,422 | 11/1988 | Kawakatsu | 437/31 |
| 4,812,417 | 3/1989 | Hirao | 437/31 |

*Primary Examiner*—Brian E. Hearn
*Assistant Examiner*—Kevin McAndrews
*Attorney, Agent, or Firm*—Wenderoth, Lind & Ponack

[57] ABSTRACT

A method of fabricating a bipolar transistor on a semiconductor substrate capable of operating at a high operating speed and formed in a compact construction. A first polycrystalline silicon layer is oxidized selectively to form areas for forming base electrodes and a collector electrode. Boron is implanted into the polycrystalline silicon layer in a high concentration to form the base electrodes, the silicon dioxide film is removed to form an opening from a region for forming an emitter, the side wall of the opening is oxidized, an inactive base is formed in the polycrystalline silicon layer, active base is formed in the inactive base by implanting boron in the inactive base. Then, the entire surface of the device is coated with an oxide film and a second polycrystalline silicon layer. The polycrystalline silicon layer and the oxide film are removed selectively through a reactive ion etching process to leave the second polycrystalline silicon layer only over the side wall of an opening through which an emitter is exposed. A third polycrystalline silicon layer is then formed over the entire surface and arsenic is diffused in the third polycrystalline silicon layer to form the emitter, and then a silicide film is formed over the surface of the third polycrystalline silicon layer.

9 Claims, 4 Drawing Sheets

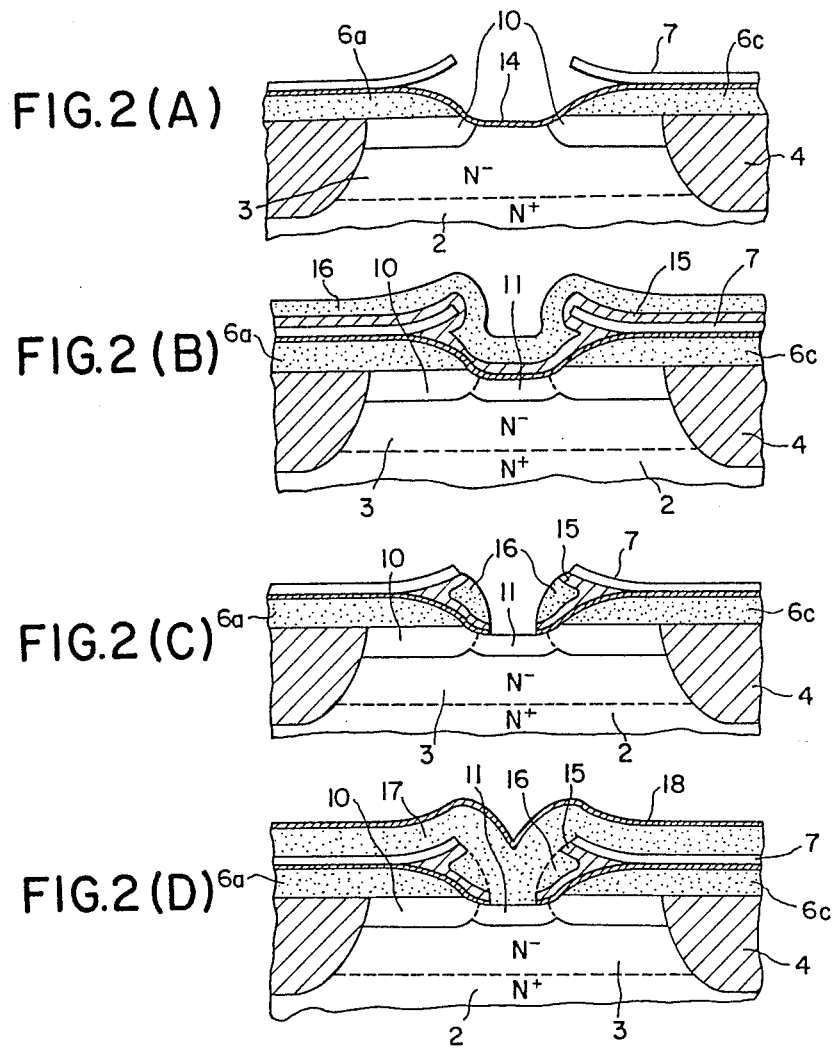

METHOD OF FABRICATING A BIPOLAR TRANSISTOR

BACKGROUND OF THE INVENTION

1. Field of the Invention

The present invention relates to a method of fabricating a high density and high speed bipolar transistor on a semiconductor substrate.

2. Description of the Related Art

Generally, a ECL/CML (emitter coupled logic/current mode logic) type bipolar semiconductor IC device is applied to fields where high-speed operation is particularly essential. When a power consumption and a logical swing are fixed, a operating speed of an ECL/CML circuit is dependent on a parasitic capacitances of component elements and a wiring of the circuit, and a base resistance and a gain-bandwidth product of transistor of the circuit. It is necessary to reduce a junction capacitance between the base and collector of the transistor particularly influential on the operating speed to reduce the parasitic capacitance of the ECL/CML circuit. The junction capacitance can be effectively reduced by drawing out the base electrode made of polycrystalline silicon outside an element of the transistor to reduce the base area. It is also a general method of reducing the parasitic capacitance to form the polycrystalline silicon and a metallic wiring line on a thick isolating oxide film.

On the other hand, it is necessary for reducing the base resistance to form an inactive base layer as near as possible to an emitter and to form the emitter in a narrow width in order to reduce the resistance of an active base layer directly below the emitter. The gain-bandwidth product can effectively be improved by reducing the depth of a junction of the emitter and the base and by forming a collector in a thin epitaxial layer.

Japanese patent application No. 61-131698 proposes the above mentioned ECL/CML type bipolar semiconductor IC device manufacturing process.

In this application, the bipolar semiconductor IC device has a boron-implanted layer having a medium boron concentration. This boron-implanted layer ("the medium base") is interposed between an inactive base having high boron concentration and an emitter.

However, the base resistance is relatively high because the resistance of the boron-implanted layer cannot be reduced to a satisfactory extent. Furthermore, since the boron-implanted layer extends under the emitter to narrow the active base, a major part of the carriers injected from the emitter into the base is recombined and hence it is difficult to enhance the current amplification factor. Still further, since a junction depth of the boron-implanted layer is large, the epitaxial layer has a thickness limited to reduce, whereby the gain-bandwidth product is prevented from improving.

SUMMARY OF THE INVENTION

Accordingly, it is an object of the present invention to provide a method of fabricating a bipolar transistor on a semiconductor substrate having low base resistance, low parasitic capacitance, high current amplification factor, improved gain-bandwidth product and a thin epitaxial layer, and capable of operating at a satisfactorily high operating speed and being formed in a compact construction.

To achieve the object of the invention, the present invention provides a method of fabricating a bipolar transistor on a semiconductor substrate, comprising steps of: forming a first polycrystalline silicon layer over a main surface of a silicon substrate having a first conductivity type land region; forming an antioxidizing film in selected areas over the surface of the first polycrystalline silicon layer; selectively oxidizing portions of the first polycrystalline silicon layer using the antioxidizing film as a mask; introducing a second conductivity type impurity through the antioxidizing film into at least some unoxidized portions of the first polycrystalline silicon layer; forming an opening by selectively removing the oxidized first polycrystalline silicon layer to expose a part of the land region; forming a thin oxide film over the surface of the exposed land region and a side surface of the opening; forming a first region of the second conductivity type in the unexposed land region; forming a second region of the second conductivity type disposed on a side of the first region by introducing a second conductivity type impurity through the thin oxide film into the land region; forming a first oxide film through a CVD process over an entire surface of the structure obtained by said steps; forming a second polycrystalline silicon layer over an entire surface of the oxide film; selectively removing the second polycrystalline silicon layer through an anisotropic etching process so that the second polycrystalline layer remains only on the side surface of the opening; etching the exposed first oxide film and thin oxide film to expose the second region; selectively forming a third polycrystalline silicon layer doped the first conductivity type impurity at least on the exposed second region; diffusing the first conductivity type impurity from the third polycrystalline silicon layer into the second region to form a third region of the first conductivity type in the second region; and forming a metal silicide film at least over the surface of a portion of the first polycrystalline silicon layer.

The present invention further provides a method of fabricating a bipolar transistor on a semiconductor ubstrate, comprising steps of: forming a first polycrystalline silicon layer over a main surface of a semiconductor substrate of a first coductivity type having a first and a second land regions of a second conductivity type on the main surface thereof, the first and the second land regions connected to each other; selectively oxidizing the first polycrystalline silicon layer excepting a first, a second and a third areas thereof, a portion of the first and the second areas located on the first land region; the third area located on the second land region; introducing a first conductivity type impurity into the first and second areas of the first polycrystalline silicon layer and a second conductivity type impurity into a collector area of the first polycrystalline silicon layer; selectively removing the oxidized first polycrystalline silicon layer located between the first and the second areas to form an opening; oxidizing the structure obtained by said steps to form a thin oxide film over the surface of the opening and to diffuse a first conductivity type impurity from the first and second areas to the substrate whereby a first and a second inactive base regions of the first conductivity type is defined in the first region; introducing the first conductivity type impurity through the thin oxide film to the first region to form an active base region connected between the first and second inactive bases in the first region; alternately forming an oxide film and a second polycrystalline silicon layer on an entire surface of the structure obtained by said steps; removing the second polycrystalline silicon layer, the oxide film and, the thin oxide film by an reactive ion etching process to expose said active base region whereby the second polycrystalline silicon layer located on a side surface of the opening only remains and the third area of the first polycrystalline silicon layer is exposed as a collector electrode; forming a third polycrystalline silicon layer of the second conductivity type on the entire surface of the structure obtained by said steps; and diffusing the first conductivity type impurity from the third polycrystalline silicon layer to the inactive base region to form an emitter region.

According to the present invention, the first region, namely, a base having a high impurity concentration, and the third region (emitter) are formed close to each other, and the electrode of the base is formed of a silicide film, so that the resistance of the base is reduced remarkably and the base is formed in a reduced area and thereby the base-collector junciton capacitance is reduced. Furthermore, since the base having a medium impurity concentration and a large depth of junction is omitted, the size can be diminished, the ipitaxial layer can be formed in a small thickness and the gain-bandwidth product is improved.

The above and other objects, features and advantages of the present invention will become fully apparent from the following description taken in conjunction with the accompanying drawings, in which:

BRIEF DESCRIPTION OF THE DRAWINGS

FIGS. 2(A) to 2(F) are enlarged fragmentary setional views of assistance in explaining the steps shown in FIGS. 1(C) to 1(F) in detail showing a portion in the vicinity of base and emitter regions; and

DESCRIPTION OF THE PREFERRED EMBODIMENT

A method of fabricating a bipolar transistor on a semiconductor substrate, in a preferred embodiment, according to the present invention will be described hereinafter with reference to FIGS. 1(A) through 1(F) and 2(A) through 2(F). In FIGS. 1(A) through 1(F) some of the films are not shown to simplify the drawings.

Figure 1A:
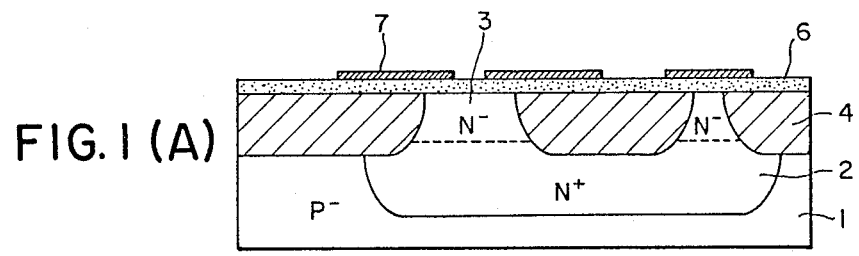
FIGS. 1(A) to 1(F) are sectional views of assistance in explaining the steps of a method of fabricating a bipolar transistor on a semiconductor substrate, in a preferred embodiment, according to the present invention.

Referring to FIG. 1(A), there are shown a $p^-$-type silicon substrate 1, an $n^-$-type buried diffused layer 2 formed in the silicon substrate 1, and $n^-$-type epitaxial layer 3 formed on the buried diffused layer 2, an isolating oxide film 4 formed over the silicon substrate 1 and the buried diffused layer 2, a polycrystalline silicon layer 6 formed over the epitaxial layer 3 and the isolating oxide film 4, and a nitride film 7 formed over the polycrystalline silicon layer 6. In the step of FIG. 1(A), after forming the isolating oxide film 4, the polycrystalline silicon layer 6 is formed in a thickness of about 3000 Å, A surface of the polycrystalline silicon layer 6 is oxidized on 200 Å to form a silicon dioxide film of a thickness of about 200 Å not shown, and then the nitride film 7 of a thickness in the range of 100 to 2000 Å is formed on the polycrystalline silicon layer 6 selectively in regions for forming a base electrode and a collector electrode.

Figure 1B:
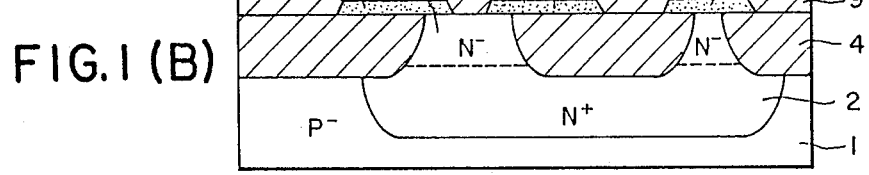

In the step of FIG. 1(B), the polycrystalline silicon layer 6 excluding polycrystalline silicon areas 6a, 6c and 6d is oxidized selectively to form a silicon dioxide film 9. Then, the nitride film 7 formed over an polycrystalline silicon area (a collector electrode) 6d, is removed selectively. Next phosphor is ion-implanted in the collector electrode, and then the structure is subjected to heat treatment to form an $n^+$-type region 5 for reducing the resistance of the collector. Then, boron is ion-implanted at a concentration of about $1\times10^{15}$ to $5\times10^{15}/cm^2$ through the nitride film 7 into the polycrystalline silicon areas 6a and 6c for forming base electrodes. The boron-implanted polycrystalline silicon areas (base electrodes) 6a and 6c are annealed at a temperature of about 900° C. to uniformly distribute a boron concentration therethrough.

Figure 1C:
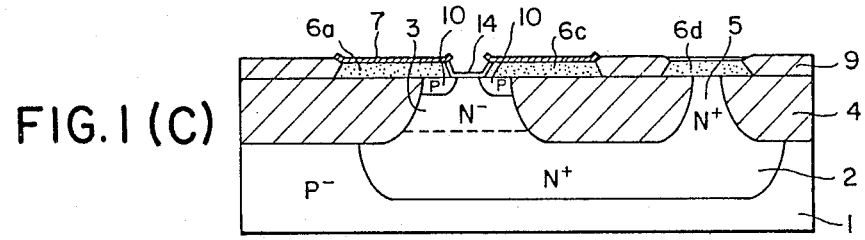

In the step of FIGS. 1(C) and 2(A), emitter region 9b of silicon dioxide film 9 is removed selectively and then the surface of the removed portion is oxidized to form an oxide film 14 having a thickness of about 200 Å. The boron ions are diffused from the polycrystalline silicon areas 6a and 6c into the epitaxial layer 3 to form $p^+$-type inactive bases 10.

Figure 1D:
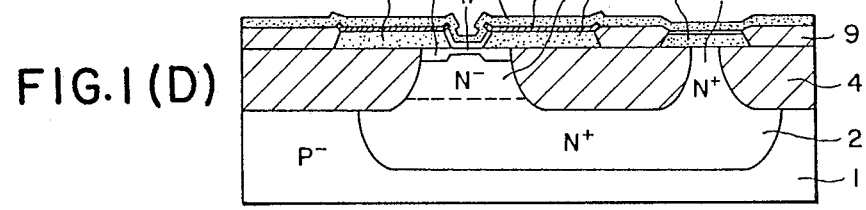

In the step of FIGS. 1(D) and 2(B), $BF_2$ (boron fluoride) is implanted into the epitaxial layer 3 at a concentration of about $1\times10^{13}$ to $5\times10^{13}/cm^2$ to form an active base 11, and then an oxide film 15 of a thickness of about 1000 Å and a polycrystalline silicon layer 16 of a thickness of about 2000 Å are formed in that order through a CVD process over the entire surface of the above obtained structure. In FIG. 1(D), the oxide film 15 is omitted.

Figure 1E:
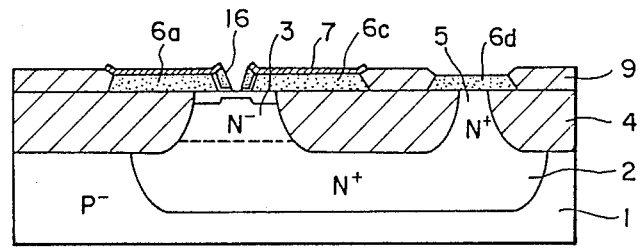

In the step of FIGS. 1(E) and 2(C), the polycrystalline silicon layer 16 and the oxide films 14 and 15 are etched successively through a reactive ion etching process to form an opening for the emitter. Since the polycrystalline silicon layer 16 and the oxide film 15 remain only over the side surface of the opening as shown in FIG. 2(C), the emitter is exposed in a size smaller than that of an removed portion of the nitride film 7 by self-alignment process. In this process, the polycrystalline silicon area 6d for the collector electrode is exposed as shown in FIG. 1(E).

In the step of FIG. 2(D), a polycrystalline silicon layer 17 is formed over the entire surface of the above obtained structure in a thickness of about 3000 Å. The surface of the polycrystalline silicon layer 17 is oxidized in a thickness of about 200 Å to form an oxide film 18, and then an arsenic is ion-implanted into the polycrystalline silicon layer 17 at a concentration of about $10^{16}/cm^2$.

Figure 2E:
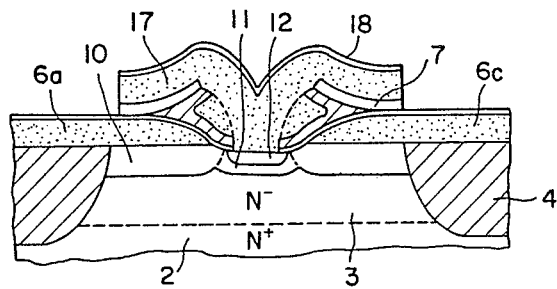

In the step of FIG. 2(E), the oxide film 18, the polycrystalline silicon layer 17 and the nitride film 7 are selectively etched and then an arsenic is diffused from the polycrystalline silicon layer 17 into the active base 11 to form an emitter 12 by heat-treatment.

Figure 2F:
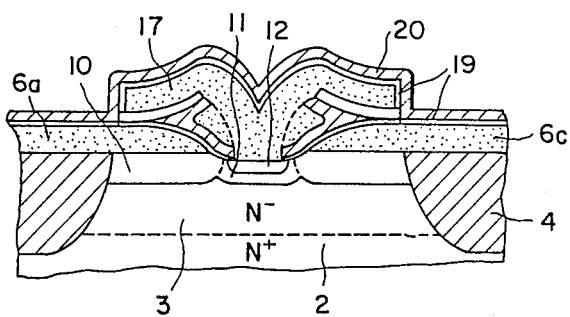

In the step of FIG. 2(F), a thin oxide films formed by the above heat treatment are removed from the surfaces of the polycrystalline silicon areas 6a and 6c and the polycrystalline silicon layer 17, and then a platinum silicide film 19 is formed over the surfaces of the polycrystalline silicon areas 6a and 6c and the polycrystalline silicon layer 17 through evaporation of platinum and heat treatment. Portions of the surfaces which need not be coated with the platinum silicide film 19 is left coated with the thin oxide film formed by the above heat treatment. Platinum adhering to the oxide film is removed by using aqua regia. Then, as shown in FIG. 2(F), an oxide film 20 is formed over the entire surface of the above obtained structure through a CVD process.

Figure 1F:
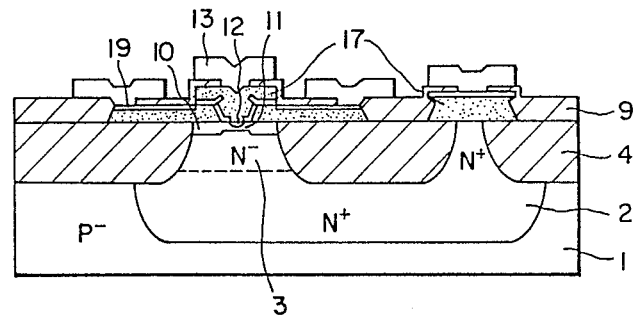

Finally, a contact hole is formed and a metallic electrode 13 is formed as shown in FIG. 1(F).

In the conventional method, the total width of the base region is five times that of the least design width when the emitter, the medium base and the inactive base are formed in the least design width, while the total width of the base region formed by the present invention is three times the least design width. Accordingly, the method of the present invention reduces the base-collector junction capacitance approximately to 60% of the conventional one. Furthermore, in the present invention, the emitter is totally or almost totally joined with the active base having a low impurity concentration and the emitter can be formed in a comparatively narrow width as compared with the conventional emitter, and thereby the emitter-base junction capacitance is reduced.

Still further, in the conventional method, since the medium base has large junction depth, the epitaxial layer is limitted to be thinned. On the other hand, in the present invention, the junction depth is 0.3 $\mu$m or below, and hence the thickness of the epitaxial layer can be reduced to 1 $\mu$m or below, so that flight time of the carriers in flying through the depletion layer is reduced. Furthermore, reduction in the junction capacitance entails reduction in the collector time constant and the emitter time constant, and the gain-bandwidth product is improved. Since the gain-bandwidth product is improved by reducing the base resistance and parasitic capacitance of the transistor, the bipolar semiconductor IC device is able to operate at a very high speed.

In the conventional method, since the medium base extends directly under the emitter, the ratio of the area of the active base to that of the emitter decreases and the effective (mean) base width increases with the increase of the design size, it is difficult to fabricate an IC device having a high current amplification factor and a high gain-bandwidth product. On the other hand, in the present invention, the inactive base extends scarcely under the emitter, and hence the IC device can be formed in a compact construction. In the conventional method, an additional special step is necessary for forming a transverse PNP transistor because boron is implanted into the entire surface of the epitaxial layer. In the present invention, since the oxide film is left unremoved between the polycrystalline silicon layers (FIGS. 1(B) and 1(C)), the transverse PNP transistor can be fabricated through the same method as that for fabricating an NPN transistor.

Furthermore, according to the present invention, it is possible to use a resistance formed simultaneously with the emitter and also possible to use the polycrystalline silicon resistance formed simultaneously with the base electrode. The use of polycrystalline silicon layer having the silicide surface for wiring increases the degree of freedom of design.

Thus, the present invention remarkably enhances the operating speed of the ECL/CML type bipolar semiconductor IC device and is applicable to fabricating high-density high-speed bipolar transistor on a semiconductor substrate, such as TTL circuits and analog (linear) circuits incorporating many transverse PNP transistors.

Although the invention has been described in its preferred form with a certain degree of particularity, obviously many changes and variations are possible therein.

It is therefore to be understood that the present invention may be practiced otherwise than specifically described herein without departing from the scope and spirit thereof.

What is claimed is:

1. A method of fabricating a bipolar transistor on a semiconductor substrate, comprising steps of:
   forming a first polycrystalline silicon layer over a main surface of a silicon substrate having a first conductivity type land region;
   forming an antioxidizing film in selected areas over the surface of the first polycrystalline silicon layer;
   selectively oxidizing portions of the first polycrystalline silicon layer using the antioxidizing film as a mask;
   introducing a second conductivity type impurity through the antioxidizing film into at least some unoxidized portions of the first polycrystalline silicon layer;
   forming an opening by selectively removing the oxidized first polycrystalline silicon layer to expose a part of the land region;
   forming a thin oxide film over the surface of the exposed land region and a side surface of the opening;
   forming a first region of the second conductivity type in the unexposed land region;
   forming a second region of the second conductivity type disposed on a side of the first region by introducing a second conductivity type impurity through the thin oxide film into the land region;
   forming a first oxide film through a CVD process over an entire surface of the structure obtained by said steps;
   forming a second polycrystalline silicon layer over an entire surface of the oxide film;
   selectively removing the second polycrystalline silicon layer through an anisotropic etching process so as to be remained the second polycrystalline silicon layer only on the side surface of the opening;
   etching the exposed first oxide film and thin oxide film to expose the second region;
   selectively forming a third polycrystalline silicon layer dopsed the first conductivity type impurity at least on the exposed second region;
   diffusing the first conductivity type impurity from the third polycrystalline silicon layer into the second region to form a third region of the first conductivity type in the second region; and
   forming a metal silicide film at least over the surface of a portion of the first polycrystalline silicon layer.

2. A method of of fabricating a bipolar transistor according to claim 1, wherein said first conductivity type is an n-type, said second conductivity type is a p-type, said first conductivity type impurity is arsenic, and said second conductivity type impurity is boron or a compound containing boron.

3. A method of fabricating a bipolar transistor according to claim 1, wherein said metal silicide is platinum silicide.

4. A method of fabricating a bipolar transistor on a semiconductor substrate, comprising steps of:
   forming a first polycrystalline silicon layer over a main surface of a semiconductor substrate of a first conductivity type having a first and a second land regions of a second conductivity type on the main surface thereof, the first and the second land regions connected to each other;

selectively oxidizing the first polycrystalline silicon layer excepting a first, a second and a third areas thereof, a portion of the first and the second areas located on the first land region; the third area located on the second land region;

introducing a first conductivity type impurity into the first and second areas of the first polycrystalline silicon layer and a second conductivity type impurity into a collector area of the first polycrystalline silicon layer;

selectively removing the oxidized first polycrystalline silicon layer located between the first and the second areas to form an opening;

oxidizing the structure obtained by said steps to form a thin oxide film over the surface of the opening and to diffuse a first conductivity type impurity from the first and second areas to the substrate whereby a first and a second inactive base regions of the first conductivity type is defined in the first region;

introducing the first conductivity type impurity through the thin oxide film to the first region to form an active base region connected between the first and second inactive bases in the first region;

alternately forming an oxide film and a second polycrystalline silicon layer on an entire surface of the structure obtained by said steps;

removing the second polycrystalline silicon layer, the oxide film and, the thin oxide film by an reactive ion etching process to expose said active base region whereby the second polycrystalline silicon layer located on a side surface of the opening only remains and the third area of the first polycrystalline silicon layer is exposed as a collector electrode;

forming a third polycrystalline silicon layer of the second conductivity type on the entire surface of the structure obtained by said steps; and diffusing the first conductivity type impurity from the third polycrystalline silicon layer to the inactive base region to form an emitter region.

5. A method of fabricating a bipolar transistor according to claim 4, wherein said selectively oxidizing step of first polycrystalline silicon layer comprises steps of:

selectively forming an antioxidizing film over the first, the second and the third areas of the first polycrystalline silicon layer;

selectively oxidezing the first polycrystalline silicon layer using the antioxidizing film as a mask; and removing the antioxidizing film.

6. A method of fabricating a bipolar transistor according to claim 5, wherein said antioxidizing film located over the first and second areas are removed after forming an emitter region, and said antioxidizing film located over the third area is removed before introducing the impurity into said third area of the first polycrystalline silicon layer.

7. A method of fabricating a bipolar transistor according to claim 4, wherein said method further comprises steps of:

annealing the structure obtained by introducing the impurity into the first and second areas to uniformly distribute said impurity.

8. A method of fabricating a bipolar transistor according to claim 4, wherein said second polycrystalline silicon layer is formed by a chemical vapor deposition process.

9. A method of fabricating a bipolar transistor according to claim 4, wherein said third polycrystalline silicon layer forming step comprises steps of:

forming a third polycrystalline silicon layer;

oxidizing a surface of the third layer to form thin oxide film; and introducing the first conductivity type impurity into the third layer.

* * * * *